(12) United States Patent
Kim

(10) Patent No.: US 11,037,842 B2
(45) Date of Patent: Jun. 15, 2021

(54) SEMICONDUCTOR DEVICE WITH INSPECTION PATTERNS

(71) Applicant: Samsung Electronics Co., Ltd., Suwon-si (KR)

(72) Inventor: Jong Doo Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/412,306

(22) Filed: May 14, 2019

(65) Prior Publication Data

US 2020/0118895 A1 Apr. 16, 2020

(30) Foreign Application Priority Data

Oct. 10, 2018 (KR) .................. 10-2018-0120197

(51) Int. Cl.
*H01L 23/58* (2006.01)
*H01L 21/66* (2006.01)
(Continued)

(52) U.S. Cl.
CPC .............. *H01L 22/30* (2013.01); *H01L 21/78* (2013.01); *H01L 22/12* (2013.01); *H01L 22/14* (2013.01); *H01L 22/26* (2013.01); *H01L 23/564* (2013.01)

(58) Field of Classification Search
CPC ... H01L 2223/54453; H01L 2223/5446; H01L 22/20; H01L 22/26; H01L 2223/544; H01L 22/30; H01L 22/12; H01L 23/564; H01L 21/78; H01L 22/14; H01L 22/34; H01L 23/544
See application file for complete search history.

(56) References Cited

U.S. PATENT DOCUMENTS 7,973,309 B2 * 7/2011 Kim .................. H01L 22/34
257/48
9,947,601 B1 4/2018 Lam et al.
(Continued)

*Primary Examiner* — Shouxiang Hu
(74) *Attorney, Agent, or Firm* — Muir Patent Law, PLLC

(57) ABSTRACT

A semiconductor device includes a first normal pattern which is disposed in an active area of a semiconductor chip, wherein the first normal pattern has a particular shape and the active area includes circuitry for operating the semiconductor chip, and includes a first defective pattern and a second normal pattern which are disposed in a dummy area of the semiconductor chip, wherein the dummy area of the semiconductor chip is an area that does not perform functions for operating the semiconductor chip. The second normal pattern has the same shape as the first normal pattern and the first defective pattern has the same shape as the first normal pattern except for a first defect. The first normal pattern is disposed at a first level layer of the semiconductor chip. The first defective pattern comprises a first part and a second part, and the second normal pattern comprises a third part corresponding to the first part and that matches the first part in shape and size and a fourth part corresponding to the second part, wherein the second part includes the first defect and matches the fourth part in shape and size except for the first defect. If the second part and fourth part were to be superimposed over each other, the second part would include a piece of material that is absent from the fourth part and that comprises the first defect.

19 Claims, 18 Drawing Sheets

(51) Int. Cl.
*H01L 23/00* (2006.01)
*H01L 21/78* (2006.01)

(56) References Cited

U.S. PATENT DOCUMENTS

| | | | |
|---|---|---|---|
| 2002/0130394 A1* | 9/2002 | Toyoda | H01L 21/76877 257/618 |
| 2010/0252828 A1* | 10/2010 | Grillberger | H01L 23/585 257/48 |
| 2011/0276935 A1 | 11/2011 | Fouquet et al. | |
| 2014/0310670 A1 | 10/2014 | Oberai | |
| 2015/0042978 A1* | 2/2015 | Lynch | H01L 22/12 356/36 |
| 2015/0356232 A1 | 12/2015 | Bomholt et al. | |
| 2016/0086863 A1 | 3/2016 | Won et al. | |
| 2016/0377678 A1 | 12/2016 | Chen et al. | |
| 2017/0192050 A1 | 7/2017 | Lei | |
| 2017/0352145 A1 | 12/2017 | Dhagat et al. | |

* cited by examiner

| NP1 | DP2 | NP1 | DP3 | NP1 | DP4 | NP1 | DP5 | DDP |
|---|---|---|---|---|---|---|---|---|
| POR1 | D1' | POR1 | D1'' | POR1 | D1''' | POR1 | D1'''' | ... |
| POR2 | D2' | POR2 | D2'' | POR2 | D2''' | POR2 | D2'''' | |

SEMICONDUCTOR DEVICE WITH INSPECTION PATTERNS

This application claims the benefit of priority to Korean Patent Application No. 10-2018-0120197, filed on Oct. 10, 2018, in the Korean Intellectual Property Office, the disclosure of which is incorporated herein in its entirety by reference.

BACKGROUND

1. Field

The present disclosure relates to a semiconductor device and a method of fabricating the same.

2. Description of the Related Art

As semiconductor devices become smaller, the rate of occurrence of random defects as well as system defects may increase when fine patterns are realized, thus reducing the yield. Such random defects may occur as a process center set at the time of initial equipment setup is gradually changed as a process is performed or according to a change in hardware condition. If the process center is changed to eventually deviate from a process window, defects may occur, thus reducing the total yield. Detecting a change in the process center after the yield is reduced causes a loss of time/physical resources. Therefore, it would be useful to detect or monitor a change in the process center in advance and correct the change in the process center before the yield is reduced.

SUMMARY

Aspects of the present disclosure provide a semiconductor device including a substrate inspection pattern for detecting a change in a process center in advance.

Aspects of the present disclosure also provide a method of fabricating a semiconductor device including a substrate inspection pattern for detecting a change in a process center in advance.

However, aspects of the present disclosure are not restricted to the ones set forth herein. The above and other aspects of the present disclosure will become more apparent to one of ordinary skill in the art to which the present disclosure pertains by referencing the detailed description of the present disclosure given below.

According to certain aspects of the disclosed embodiments, a semiconductor device includes a first normal pattern which is disposed in an active area of a semiconductor chip, wherein the first normal pattern has a particular shape and the active area includes circuitry for operating the semiconductor chip, and includes a first defective pattern and a second normal pattern which are disposed in a dummy area of the semiconductor chip, wherein the dummy area of the semiconductor chip is an area that does not perform functions for operating the semiconductor chip. The second normal pattern has the same shape as the first normal pattern and the first defective pattern has the same shape as the first normal pattern except for a first defect. The first normal pattern is disposed at a first level layer of the semiconductor chip. The first defective pattern comprises a first part and a second part, and the second normal pattern comprises a third part corresponding to the first part and that matches the first part in shape and size and a fourth part corresponding to the second part, wherein the second part includes the first defect and matches the fourth part in shape and size except for the first defect. If the second part and fourth part were to be superimposed over each other, the second part would include a piece of material that is absent from the fourth part and that comprises the first defect.

According to certain aspects of the disclosed embodiments, a semiconductor device includes a first, non-operating, pattern which is disposed in a dummy area of a semiconductor chip and comprises first inspection patterns arranged successively, and a second, operating, pattern which is disposed in an active area of the semiconductor chip and is for operating the semiconductor chip. Each of the first inspection patterns comprises one or more first defective patterns and a plurality of first normal patterns, wherein each of the first normal patterns comprises a first part and a second part, and each of the first defective patterns comprises a third part corresponding to the first part and a fourth part corresponding to the second part, wherein the first part matches the third part in shape and size, and the second part and the fourth part match each other in shape and size except for a first defect. If the second part and fourth part were to be superimposed over each other, the fourth part would include a piece of material that is absent from the second part and that comprises the first defect, or the second part would include a piece of material that is absent from the fourth part such that the missing material in the fourth part comprises the first defect.

According to certain aspects of the disclosed embodiments, a method of fabricating a semiconductor device includes forming a first normal pattern in an active area of a semiconductor substrate, forming a first inspection pattern, which comprises a first defective pattern and a second normal pattern, in a dummy area of the semiconductor substrate, cutting the semiconductor substrate to form a plurality of semiconductor chips, and fabricating a plurality of semiconductor devices using the plurality of semiconductor chips. A shape of the second normal pattern is the same as a shape of the first normal pattern, the first normal pattern and the first inspection pattern are formed at the same level layer during fabricating the semiconductor device, the first defective pattern comprises a first part and a second part, and the second normal pattern comprises a third part corresponding to the first part and a fourth part corresponding to the second part, wherein the first part and the third part have the same size and shape, and the second part and the fourth part have a different size and/or shape. If the first normal pattern were to be superimposed over the first defective pattern, the first part would match the third part, and the second part would not match the fourth part.

BRIEF DESCRIPTION OF THE DRAWINGS

These and/or other aspects will become apparent and more readily appreciated from the following description of various embodiments, taken in conjunction with the accompanying drawings in which.

DETAILED DESCRIPTION

Figure 1:
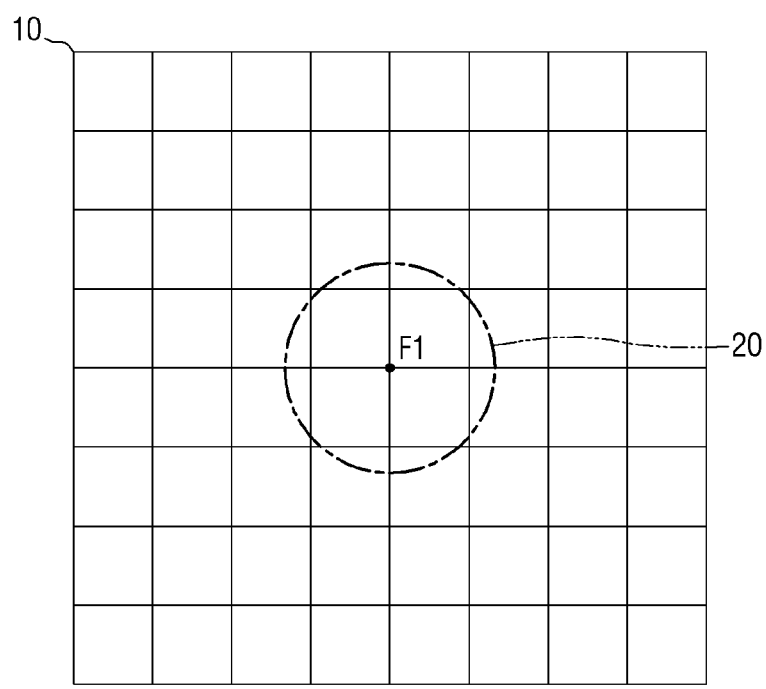
FIG. 1 is a diagram for explaining a process window and a process variation.
Figure 2:
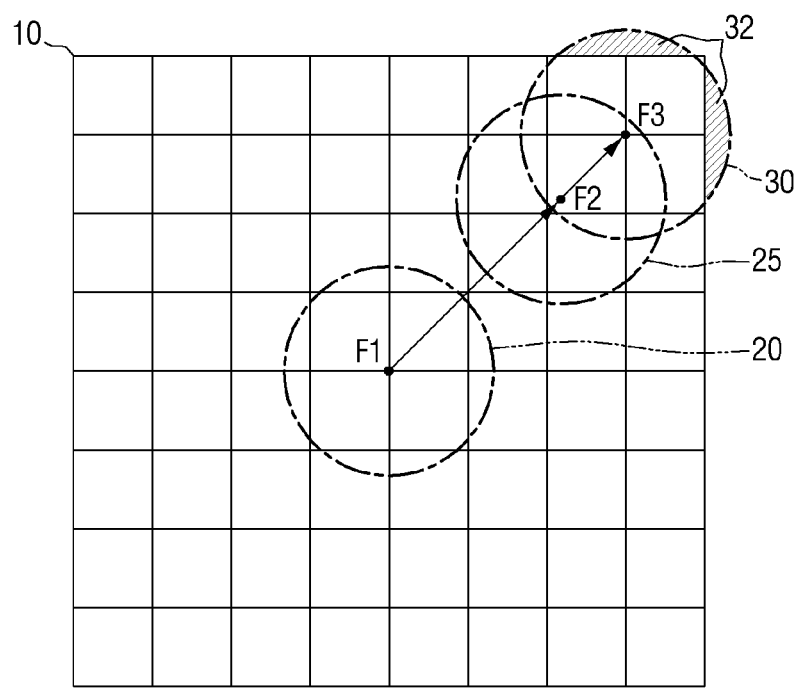
FIG. 2 is a diagram for explaining the relationship between a process center and a yield.

FIG. 1 is a diagram for explaining a process window and a process variation. FIG. 2 is a diagram for explaining the relationship between a process center and a yield.

Referring to FIG. 1, a first process window 10 represents a tolerance range of parameters of a specific process. When a process is performed outside the first process window 10, a defect may occur in the process result, causing a reduction in the yield of the process. For example, the first process window 10 may represent an exposure amount and an error in depth of focus in a photolithography process. For ease of description, it will be assumed that the specific process is a photolithography process, the horizontal axis of the first process window 10 indicates the exposure amount of the photolithography process, and the vertical axis of the first process window 10 indicates the error in depth of focus of the photolithography process, but embodiments are not limited to this case.

A first process variation area 20 represents the degree of variation in the exposure amount and error in depth of focus of the photolithography process when the process center is located at a first point F1. The process center denotes, for example, a target exposure amount and a target error in depth of focus of photolithography equipment. A variation in the exposure amount and a variation in the error in depth of focus of the photolithography process may arise from the position of a substrate, but embodiments are not limited to this case. As another example, the variation in the exposure amount and the variation in the error in depth of focus of the photolithography process may arise from a process, voltage and temperature (PVT) variation.

When the process center for the photolithography process is located at the first point F1, even if the photolithography process is changed, the exposure amount and the error in depth of focus of the photolithography process may all be included in the first process window 10, thus ensuring the yield. For example, since the first process variation area 20 is included in the first process window 10 when the process center is located at the center of the first process window 10, the yield can be ensured. Therefore, when initially setting equipment or performing maintenance of the equipment, an operator may adjust a process recipe or modify hardware such that the process center is located at the first point F1.

However, when the photolithography process is repeatedly performed, the process center can be changed to another position due to various causes. For example, the process center can be changed due to an error in software/firmware or can be changed according to hardware condition. This will be described in detail with reference to FIG. 2.

Referring to FIG. 2, the process center may be changed from the first point F1 to a second point F2. Here, a second process variation area 25 may be included in the first process window 10. The second process variation area 25 represents the degree of variation in the exposure amount and error in depth of focus of the photolithography process when the process center is located at the second point F2. When the process center is located at the second point F2, even if the photolithography process is changed, the exposure amount and the error in depth of focus of the photolithography process may all be included in the first process window 10, thus ensuring the yield. Therefore, even if the process center is changed from the first point F1 to the second point F2, the yield can be ensured because the second process variation area 25 is still included in the first process window 10.

Later, the process center may be changed from the second point F2 to a third point F3. Here, at least a part of a third process variation area 30 may not be included in the first process window 10. The third process variation area 30 represents the degree of variation in the exposure amount and error in depth of focus of the photolithography process when the process center is located at the third point F3. Therefore, when the process center is changed from the second point F2 to the third point F3, the exposure amount and the error in depth of focus of the photolithography process may deviate from the first process window 10 in some cases. At least a part of the third process variation area 30 which is not included in the first process window 10 will be referred to as a defective area 32 for the sake of convenience. Therefore, if the photolithography process is performed in the defective area 32 due to a change in the photolithography process, a defect may occur in the process result. Hence, the total process yield may be reduced when the process center is located at the third point F3.

As illustrated in FIGS. 1 and 2, the first process window 10 may be set larger than the first, second and third process variation areas 20, 25 and 30. Therefore, even if the process center is changed from the first point F1 to the second point F2, the second process variation area 25 is still included in the first process window 10, thus ensuring the yield of the photolithography process. Therefore, even if the process center is changed from the first point F1 to the second point F2, the yield may be unaffected as long as the whole of the second process variation area 25 is included in the first process window 10. Therefore, since the change of the process center from the first point F1 to the second point F2 does not affect the total yield, it may not be possible to identify whether the process center has been changed.

However, when the process center is changed from the second point F2 to the third point F3 (or if it is changed directly from the first point F1 to the third point F3), the total yield is reduced, in which case the change in the process center can be identified. Since a reduction in yield increases cost, it is important to detect a change in the process center before the yield is reduced.

Figure 3:
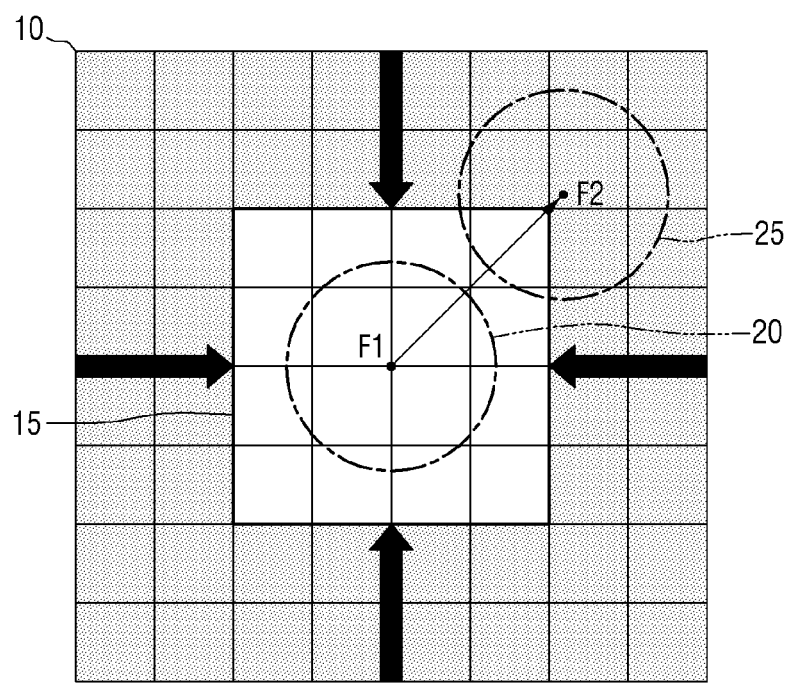
FIG. 3 is a diagram for explaining a reduced process window and detection of a change in the process center according to embodiments.

FIG. 3 is a diagram for explaining a reduced process window and detection of a change in the process center according to certain embodiments.

Referring to FIG. 3, the process window can be reduced from a first process window 10 to a second process window 15 using a method according to certain embodiments. Here, the first process window 10 may be a range in which the yield of actual process results is ensured. The second process window 15 may be a range in which it is determined that the process center has not been changed.

In a case where the process center is changed from the first point F1 to the second point F2, the second point F2 and at least a part of the second process variation area 25 deviate from the second process window 15. Therefore, it can be determined that the process center has been changed. However, since the second point F2 and the second process variation area 25 are still included in the first process window 10, there may be no great change in the yield. Therefore, according to some embodiments, it is possible to detect a change in the process center before the yield is reduced.

According to some embodiments, a defect may be intentionally formed in a specific area (e.g., a dummy area 130 in FIG. 5) to reduce the process window. For example, when a defect is formed in a specific area, a process margin is reduced, resulting in a reduction of the process window. Therefore, a substrate inspection pattern (e.g., SIP in FIG. 4) including an intentional defect may be formed in a specific area to reduce the process window only in the specific area, and the specific area may be monitored to detect in advance whether the process center has been changed. This will now be described in detail with reference to the attached drawings.

Figure 4:
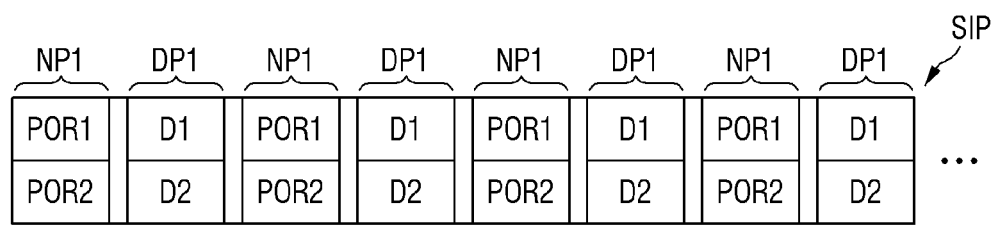
FIG. 4 illustrates a substrate inspection pattern SIP according to embodiments.
Figure 4:
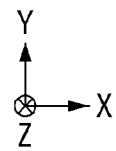
Figure 5:
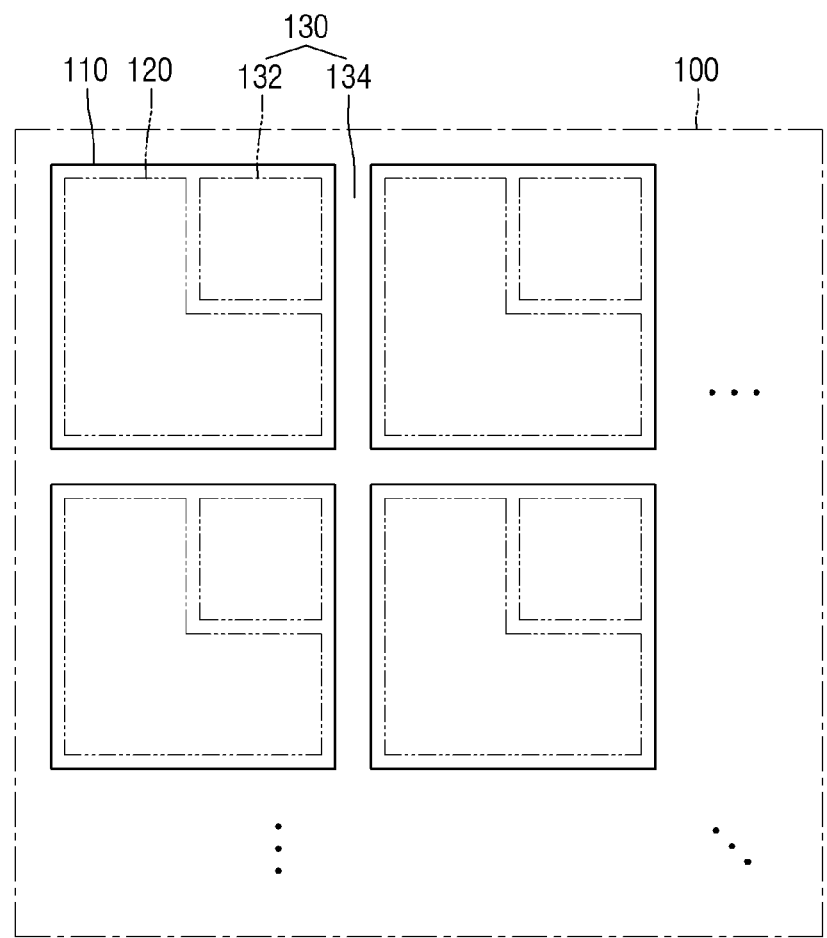
FIG. 5 illustrates an area in which the substrate inspection pattern SIP according to certain embodiments is disposed.

FIG. 4 illustrates a substrate inspection pattern SIP according to certain embodiments. FIG. 5 illustrates an area in which the substrate inspection pattern SIP according to these embodiments is disposed.

Referring to FIG. 4, the substrate inspection pattern SIP may include first normal patterns NP1 and first defective patterns DP1 arranged alternately. Each of the first normal patterns NP1 may include a first non-defective structure POR1 and a second non-defective structure POR2. Each of the defective patterns DP1 may include a first defective structure D1 and a second defective structure D2. The first normal patterns NP1 and the first defective patterns DP1 may be located at the same level layer of a substrate. For example, if a vertical direction is defined as a Z direction, the first normal patterns NP1 and the first defective patterns DP1 may be disposed in an X-Y plane at the same height of a substrate on the Z axis. It should be noted that terms such as "pattern" and "structure" may be used interchangeably to refer to certain items, or may be used separately in connection with certain figures to refer to different portions of the figures.

The first non-defective structure POR1 and the second non-defective structure POR2 may not include an intentional defective structure. The "intentional defective structure" refers to a defective structure intentionally formed by a user to reduce the process window. Thus, an "intentional defective structure" is formed and known to a manufacturer in advance of testing, by design.

The first defective structure D1 and the second defective structure D2 may each include an intentional defective structure. For example, the first defective structure D1 may be the result of the user intentionally forming a defective structure next to the first non-defective structure POR1 to reduce the process window. The second defective structure D2 may be the result of the user intentionally forming a defective structure next to the second non-defective structure POR2 to reduce the process window.

Referring to FIG. 5, a substrate 100 may include a plurality of semiconductor devices (or semiconductor chips) 110. Each of the semiconductor devices 110 may include an active area 120 in which a circuit, structure or wiring used for operating the semiconductor device 110 is formed and an inactive area 132 in which a circuit, structure or wiring is not formed, or in which no components are connected to any signal-transferring component. As such, components or materials formed in the inactive area 132 do not receive or transmit signals used for operation. For ease of description, a structure such as a circuit, structure or wiring used for operating any of the semiconductor devices 110 will be referred to as an operating pattern OP (see FIG. 6). Structures or patterns that are not used for operating any of the semiconductor devices 110 may be referred to as non-operating patterns. For example, these non-operating patterns may be formed in the inactive area 132 or the cutting area 134, which is described below.

For example, the substrate 100 may include a cutting area 134 for separating the semiconductor devices 110 into single semiconductor devices 110. That is, the cutting area 134, also described as a scribe region, is an area where a sawing or other cutting process is performed, and the semiconductor devices 110 included in the substrate 100 may be separated into single semiconductor devices 110 by the sawing or cutting process.

The substrate inspection pattern SIP according to the embodiments may be formed in the inactive area 132 and/or the cutting area 134 of the substrate 100. For ease of description, the inactive area 132 and/or the cutting area 134 will be described as a dummy area 130. The dummy area 130 may refer to any one of the inactive area 132 and the cutting area 134 or both the inactive area 132 and the cutting area 134, and as used herein may refer to an area where signals are not transmitted or received or for which any signals transmitted or received are not used for operation of the semiconductor device.

According to certain embodiments, the substrate inspection pattern SIP may be formed in the dummy area 130. For example, the first normal patterns NP1 and the first defective patterns DP1 may be disposed in the dummy area 130. Therefore, the first defective structures D1 and the second defective structures D2 may be disposed in the dummy area 130. Since the first defective structures D1 and the second defective structures D2 are disposed in the dummy area 130, the process window of the dummy area 130, which may be later set during a testing or inspecting process, may be the second process window 15.

According to certain embodiments, the dummy area 130 does not overlap the active area 120. For example, the substrate inspection pattern SIP may not be disposed in the active area 120. Therefore, even if the substrate inspection pattern SIP is formed, the operating pattern OP (see FIG. 6) of each of the semiconductor devices 110 may not include an intentional defective structure. Therefore, the process window of the active area 120, which may be later set during a testing or inspecting process, may be the first process window 10. For illustrative purposes, reference will be made to FIGS. 6 and 7.

Figure 6:
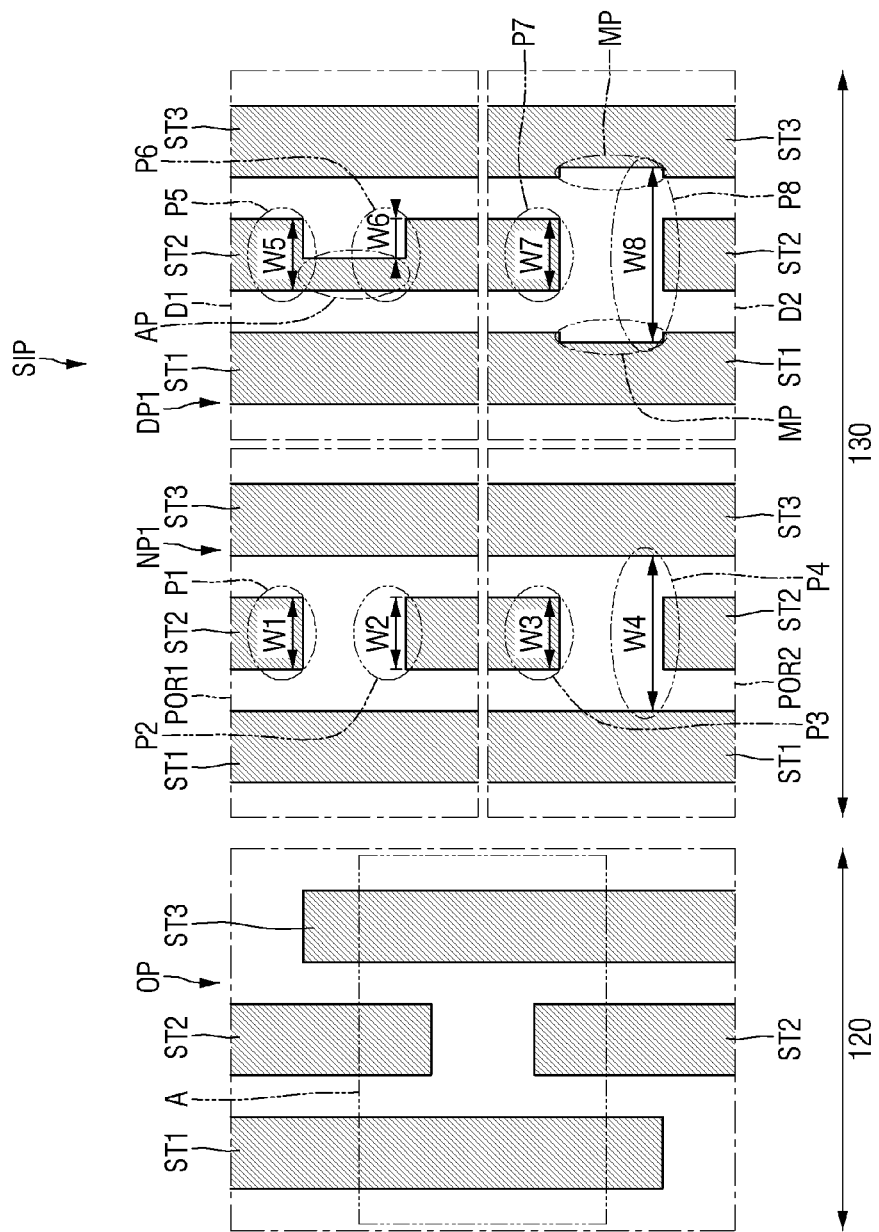
FIGS. 6 and 7 are respectively diagrams for explaining an operating pattern OP, a first normal pattern NP1 and a first defective pattern DP1 according to embodiments.
Figure 7:
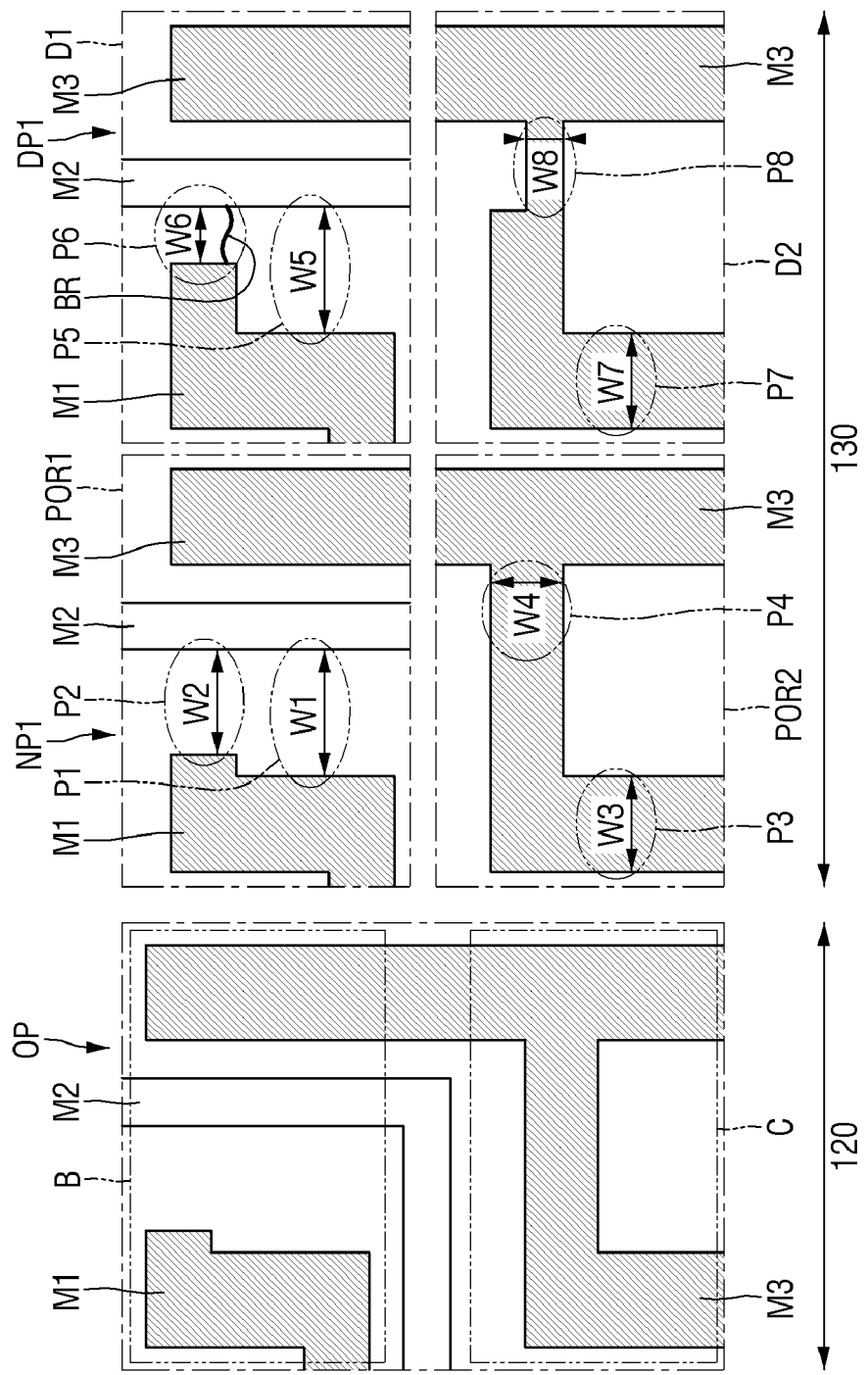

FIGS. 6 and 7 are respectively diagrams for explaining an operating pattern OP, a first normal pattern NP1 and a first defective pattern DP1 according to embodiments.

Referring to FIGS. 4 through 6, an operating pattern OP may be disposed in the active area 120 of the substrate 100. In addition, a substrate inspection pattern SIP may be disposed in the dummy area 130 of the substrate 100. A first normal pattern NP1 and a first defective pattern DP1 may be alternately disposed in the dummy area 130 of the substrate 100. A normal pattern may include, for example, patterns that have the same shape (e.g., same length and/or width, or same rectangular or "L" shapes), from a plan view, as patterns of the operating pattern OP. A defective pattern may include a shape that is different from the patterns of the operating pattern OP, such as shapes having edges with recesses or protrusions, compared to straight edges of the operating pattern OP, or shapes with different widths or lengths as those of the operating pattern OP.

The operating pattern OP may include a first structure ST1, a second structure ST2, and a third structure ST3. The second structure ST2 is completely separated into parts spaced apart from each other. The first through third structures ST1 through ST3 may be structures used for operating a semiconductor device 110.

The first normal pattern NP1 may include a first non-defective structure POR1 and a second non-defective structure POR2. The shape of the first non-defective structure POR1 may be the same as the shape of at least a part (A) of the operating pattern OP. The shape of the second non-defective structure POR2 is the same as the shape of at least a part (A) of the operating pattern OP. In one embodiment, the first non-defective structure POR1 and the second non-defective structure POR2 may be structures having the same size and shape and formed of the same material.

The first non-defective structure POR1 may include a first part P1 and a second part P2. The first part P1 may have a first width W1, and the second part P2 may have a second width W2. The second non-defective structure POR2 may include a third part P3 and a fourth part P4. The third part P3 may have a third width W3, and the fourth part P4 may have a fourth width W4.

The first defective pattern DP1 may include a first defective structure D1 and a second defective structure D2. According to embodiments, the first defective structure D1 may be obtained by forming an intentional structural defect as compared to the first non-defective structure POR1. For example, the defect may include an additional piece of structural material that is not included in the first non-defective structure POR1. So, within the same plan-view area-size, the first defective structure D1 may include all of the pattern included in the first non-defective structure POR1, with additional structural elements, such as an additional piece of material AP. The second defective structure D2 may be obtained by forming an intentional structural defect as compared to the second non-defective structure POR2. For example, the defect may include missing pieces of structural material compared to the second non-defective structure POR2. So, within the same plan-view area-size, the second defective structure D2 may include all of the pattern included in the second non-defective structure POR2, with the exception of one or more missing pieces of material MP. The first defective structure D1 may include a fifth part P5 and a sixth part P6. The fifth part P5 may have a fifth width W5, and the sixth part P6 may have a sixth width W6. The second defective structure D2 may include a seventh part P7 and an eighth part P8. The seventh part P7 may have a seventh width W7, and the eighth part P8 may have an eighth width W8.

According to embodiments, the first part P1 of the first non-defective structure POR1 may correspond to the fifth part P5 of the first defective structure D1. The first width W1 of the first part P1 may be the same as the fifth width W5 of the fifth part P5. In addition, the second part P2 of the first non-defective structure POR1 may correspond to the sixth part P6 of the first defective structure D1. The second width W2 of the second part P2 may be different from the sixth width W6 of the sixth part P6. For example, the second width W2 may be greater than the sixth width W6. For example, because an extra piece of material AP may be included in the first defective structure D1, a top edge of the sixth part P6 of the first defective structure D1 may have a shorter width than a top edge of a corresponding part (e.g., second part P2) of the first non-defective structure POR1.

According to certain embodiments, the third part P3 of the second non-defective structure POR2 may correspond to the seventh part P7 of the second defective structure D2. The third width W3 of the third part P3 may be the same as the seventh width W7 of the seventh part P7. In addition, the fourth part P4 of the second non-defective structure POR2 may correspond to the eighth part P8 of the second defective structure D2. The fourth width W4 of the fourth part P4 may be different from the eighth width W8 of the eighth part P8. For example, the fourth width W4 may be smaller than the eighth width W8. Thus, each first structure ST1 and third structure ST3 of the second defective structure D2 may have a recess in an outer edge, such that a width between facing edges of the first structure ST1 and third structure ST3 is greater for the eight part P8 than the width between facing edges of the first structure ST1 and third structure ST3 for the corresponding fourth part P4. Therefore, the first part P1 and the third part P3 of the first normal pattern NP1 may have the same widths as the fifth part P5 and the seventh part P7 of the first defective pattern DP1, respectively. In addition, the second part P2 and the fourth part P4 of the first normal pattern NP1 may have different widths from the sixth part P6 and the eighth part P8 of the first defective pattern DP1, respectively.

The first defective structure D1 and the second defective structure D2 may be different defective structures. For example, as illustrated in FIG. 6, a second structure ST2 of the first defective structure D1 may not include completely separated pieces. This will be referred to as an undercut defect for the sake of convenience. In the second defective structure D2, a second structure ST2 may be completely separated, but a first structure ST1 and a third structure ST3 may be include recessed edges. This will be referred to as an overcut defect for the sake of convenience. The first, second, and third structures ST1, ST2, and ST3 may be, for example, conductive lines formed of a metal material or other conductive material.

It should be noted that ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Referring to FIG. 7, an operating pattern OP may include a first wiring Ml, a second wiring M2, and a third wiring M3.

A first normal pattern NP1 may include a first non-defective structure POR1 and a second non-defective structure POR2. The shape of the first non-defective structure POR1 may be the same as the shape of at least a part (B) of the operating pattern OP. The shape of the second non-defective structure POR2 is the same as the shape of at least a part (C) of the operating pattern OP. Therefore, the first non-defective structure POR1 and the second non-defective structure POR2 may be different-shaped structures.

The first non-defective structure POR1 may include a first part P1 and a second part P2. The first part P1 may include an edge of the first wiring M1 and an edge of the second wiring M2, and may include a first width W1 between the edge of the first wiring M1 and the edge of the second wiring M2 in a first direction. The second part P2 may include an edge of the first wiring M1 and an edge of the second wiring M2, and may include a second width W2 between the edge of the first wiring M1 and the edge of the second wiring M2 in the first direction. The edge of the second wiring M2 in the first part P1 may be the same edge as the edge of the second wiring M2 in the second part P2. The second non-defective structure POR2 may include a third part P3 and a fourth part P4. The third part P3 may be a portion of third wiring M3 and may have a third width W3 between opposite edges in the first direction, and the fourth part P4 may be a portion of third wiring M3 and may have a fourth width W4 between opposite edges in a second direction perpendicular to the first direction.

A first defective pattern DP1 may include a first defective structure D1 and a second defective structure D2. According to certain embodiments, the first defective structure D1 may be obtained by forming an intentional electrical defect compared to the first non-defective structure POR1. The second defective structure D2 may be obtained by forming an intentional electrical defect compared to the second non-defective structure POR2.

The first defective structure D1 may include a fifth part P5 and a sixth part P6 that respectively correspond to the first part P1 and second part P2 of the first non-defective structure POR1. The fifth part P5 may include an edge of the first wiring M1 and an edge of the second wiring M2, and may include a fifth width W5 between the edge of the first wiring M1 and the edge of the second wiring M2 in a first direction, and the sixth part P6 may include an edge of the first wiring M1 and an edge of the second wiring M2, and may include a sixth width W6 between the edge of the first wiring M1 and the edge of the second wiring M2 in a first direction. The second defective structure D2 may include a seventh part P7 and an eighth part P8 that respectively correspond to the third part P3 and fourth part P4 of the second non-defective structure POR2. The seventh part P7 may be a portion of third wiring M3 and may have a seventh width W7 between opposite edges in the first direction, and the eighth part P8 may be a portion of third wiring M3 and may have an eighth width W8 between opposite edges in the second direction.

According to certain embodiments, the first part P1 of the first non-defective structure POR1 may correspond to the fifth part P5 of the first defective structure D1. The first width W1 of the first part P1 may be the same as the fifth width W5 of the fifth part P5 in the first direction. In addition, the second part P2 of the first non-defective structure POR1 may correspond to the sixth part P6 of the first defective structure D1. The second width W2 of the second part P2 may be different from the sixth width W6 of the sixth part P6 in the first direction. For example, the second width W2 may be greater than the sixth width W6. Thus, the first wiring M1 in the first defective structure D1 may have an additional piece of material attached (in a continuous manner) to an end of the structure, compared to the first wiring M1 of the first non-defective structure POR1.

According to certain embodiments, the third part P3 of the second non-defective structure POR2 may correspond to the seventh part P7 of the second defective structure D2. The third width W3 of the third part P3 may be the same as the seventh width W7 of the seventh part P7. In addition, the fourth part P4 of the second non-defective structure POR2 may correspond to the eighth part P8 of the second defective structure D2. The fourth width W4 of the fourth part P4 may be different from the eighth width W8 of the eighth part P8. For example, the fourth width W4 may be greater than the eighth width W8. Therefore, the first part P1 and the third part P3 of the first normal pattern NP1 may have the same widths as the fifth part P5 and the seventh part P7 of the first defective pattern DP1, respectively. In addition, the second part P2 and the fourth part P4 of the first normal pattern NP1 may have different widths from the sixth part P6 and the eighth part P8 of the first defective pattern DP1, respectively.

The first defective structure D1 and the second defective structure D2 may be different defective structures. For example, as illustrated in FIG. 7, in the first defective structure D1, a gap between a first wiring M1 and a second wiring M2 may be reduced to generate a bridge BR. This will be referred to as a bridge defect for the sake of convenience. In the second defective structure D2, the width of a part of a third wiring M3 may be changed to change the resistance of the third wiring M3. This will be referred to as a resistance defect for the sake of convenience.

Although the undercut defect, the overcut defect, the bridge defect, and the resistance defect have been described using FIGS. 6 and 7, embodiments are not limited to these cases. Those of ordinary skill in the art to which embodiments pertain will be able to implement the technical spirit of the embodiments by selecting and combining various types of defects.

The embodiments of FIGS. 6 and 7 have been described above in connection with different widths of parts of a structure. However, these figures can also be described in a different manner. For example, both of these figures depict a first normal pattern which is disposed in an active area of a semiconductor chip (e.g., operating pattern OP). The first normal pattern has a particular shape (e.g., as depicted in parts (A), (B), or (C) of FIG. 6 or 7). As mentioned further below, the active area includes circuitry for operating the semiconductor chip. The semiconductor chip further includes a first defective pattern (e.g., D1 or D2 of FIG. 6 or 7) and a second normal pattern (e.g., POR1 or POR2 of FIG. 6 or 7), which are disposed in a dummy area of the semiconductor chip. The dummy area of the semiconductor chip may be an area that does not perform functions for operating the semiconductor chip. The second normal pattern may have the same shape as the first normal pattern, and the first defective pattern may have the same shape as the first normal pattern except for a first defect (e.g., a recess or protrusion in the pattern). For example, the first defective pattern may include a first part and a second part, and the second normal pattern may comprise a third part corresponding to the first part and that matches the first part in shape and size and a fourth part corresponding to the second part. The second part may include the first defect and matches the fourth part in shape and size except for the first defect. For example, the first part in FIG. 6 may be ST1 and ST3 of the first defective pattern (e.g., D1), which matches the corresponding structure (described above as the "third part") of the second normal pattern (e.g., POR1 of FIG. 6, ST1 and ST3). As can be seen in FIG. 6, for example, if the second part (e.g., ST2 of the first defective pattern such as D1) and fourth part (e.g., ST2 of the first non-defective pattern such as POR2) were to be superimposed over each other, e.g., from a top-down view, the second part would include a piece of material (e.g., AP) that is absent from the fourth part and that comprises the first defect. In this manner, the second part including the first defect has an extended portion compared to the fourth part.

As can be seen looking back to FIG. 4, the first defective pattern may be one of a plurality of identical first defective patterns, and the second normal pattern may be one of a plurality of identical second normal patterns, and the plurality of identical first defective patterns and plurality of second normal patterns are alternately disposed at a first level layer.

If the same superimposing were done for the second non-defective pattern (e.g., POR2) and second defective pattern (e. D2), a different defect would be present, which includes material missing from the structure that forms the portions ST1 and ST2 of the second detective pattern (e.g., D2). For example, the second defective pattern (e.g., D2) and a third normal pattern (e.g., POR2) may be disposed in the dummy area of the semiconductor chip, and the third normal pattern may have the same shape as the first normal pattern, while the second defective pattern has the same shape as the first normal pattern (and third normal pattern) except for a second defect different from the first defect. For example, the third normal pattern may include a fifth part (e.g., ST2 of the second non-defective structure POR2) and a sixth part (e.g., ST1 and ST3 of the second non-defective structure POR2), and the second defective pattern may include a seventh part (e.g., ST2 of the second defective structure D2) corresponding to the fifth part and that matches the fifth part in shape and size and an eighth part (e.g., ST1 and ST3 of the second defective structure D2) corresponding to the sixth part and that includes the second defect and matches the sixth part in shape and size except for the defect. Here, if the sixth part and eighth part were to be superimposed over each other, the sixth part would include a piece of material that is absent from the eighth part, and that missing material comprises the second defect.

Figure 8:
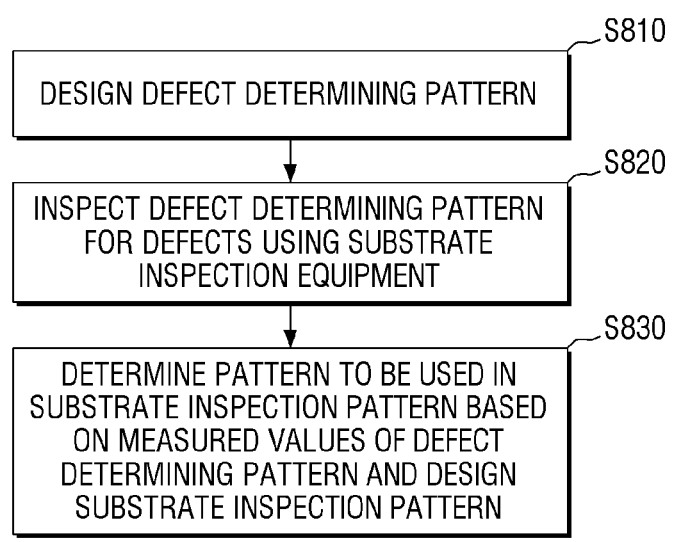
FIG. 8 is a flowchart illustrating a method of determining a first defective structure and a second defective structure to be included in a substrate inspection pattern according to embodiments.

FIG. 8 is a flowchart illustrating a method of determining a first defective structure and a second defective structure to be included in a substrate inspection pattern according to certain embodiments.

First, a defect determining pattern DDP (see FIG. 9) is designed (operation S810). The defect determining pattern DDP (see FIG. 9) may be a pattern used to determine the size of a defective structure intentionally formed in a substrate inspection pattern SIP. The defect determining pattern DDP may be fabricated on a semiconductor device to be tested or inspected, for example. This will be described in detail with reference to FIG. 9.

Figure 9:
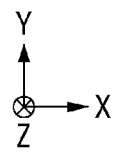
FIG. 9 illustrates a defect determining pattern DDP according to embodiments.

FIG. 9 illustrates a defect determining pattern DDP according to embodiments.

Referring to FIG. 9, the defect determining pattern DDP may include first normal patterns NP1, a second defective pattern DP2, a third defective pattern DP3, a fourth defective pattern DP4, and a fifth defective pattern DP5. The type and number of defective patterns can vary depending on embodiments. The first normal patterns NP1 and the second through fifth defective patterns DP2 through DP5 may be formed at the same level layer.

The second defective pattern DP2 may include a $(1-1)^{th}$ defective structure D1' and a $(2-1)^{th}$ defective structure D2'. The third defective pattern DP3 may include a $(1-2)^{th}$ defective structure D1" and a $(2-2)^{th}$ defective structure D2". The fourth defective pattern DP4 may include a $(1-3)^{th}$ defective structure D1"' and a $(2-3)^{th}$ defective structure D2"'. The fifth defective pattern DP5 may include a $(1-4)^{th}$ defective structure D1"" and a $(2-4)^{th}$ defective structure D2"". According to embodiments, the $(1-1)^{th}$ through $(2-4)^{th}$ defective structures D1 through D2"" may be intentionally formed defective structures, with the numerical designators merely being used as a naming convention.

The defect determining pattern DDP may include the first normal patterns NP1 and the intentional defective patterns DP2 through DP5 arranged alternately. In other words, the defect determining pattern DDP may include the first normal pattern NP1, the second defective pattern DP2, the first normal pattern NP1, the third defective pattern DP3, the first normal pattern NP1, the fourth defective pattern DP4, the first normal pattern NP1, and the fifth defective pattern DP5 arranged in this order. Therefore, the defect determining pattern DDP may include non-defective structures POR1 and POR2 and defective structures D1', D2', D1", D2", D1"', D2"', D1"" and D2"" arranged alternately.

According to embodiments, the $(1-1)^{th}$ defective structure D1', the $(1-2)^{th}$ defective structure D1", the $(1-3)^{th}$ defective structure D1"' and the $(1-4)^{th}$ defective structure D1"" may include undercut defects (e.g., resulting in additional pieces of material compared to the first non-defective structure POR1 of the normal pattern NP1), and the $(2-1)^{th}$ defective structure D2', the $(2-2)^{th}$ defective structure D2", the $(2-3)^{th}$ defective structure D2"' and the $(2-4)^{th}$ defective structure D2"" may include overcut defects (e.g., resulting in removed pieces of material compared to the second non-defective structure POR2 of the normal pattern NP1. According to embodiments, the $(1-1)^{th}$ defective structure D1', the $(1-2)^{th}$ defective structure D1", the $(1-3)^{th}$ defective structure D1"' and the $(1-4)^{th}$ defective structure D1"" may be bridge defects, and the $(2-1)^{th}$ defective structure D2', the $(2-2)^{th}$ defective structure D2", the $(2-3)^{th}$ defective structure D2"' and the $(2-4)^{th}$ defective structure D2"" may be resistance defects. However, these are only examples used for ease of description, and embodiments are not limited to these examples. Those of ordinary skill in the art to which embodiments pertain will be able to select various types of defects.

According to certain embodiments, the $(1-1)^{th}$ defective structure D1', the $(1-2)^{th}$ defective structure D1", the $(1-3)^{th}$ defective structure D1"' and the $(1-4)^{th}$ defective structure D1"" may be defects of the same type and different sizes. For example, the $(1-1)^{th}$ defective structure D1' may be smaller than the $(1-2)^{th}$ defective structure D1". For example, the $(1-2)^{th}$ defective structure D1" may be smaller than the $(1-3)^{th}$ defective structure D1"'. For example, the $(1-3)^{th}$ defective structure D1"' may be smaller than the $(1-4)^{th}$ defective structure D1"". Using FIG. 6 or 7 as examples, the $(1-1)^{th}$ defective structure D1', the $(1-2)^{th}$ defective structure D1", the $(1-3)^{th}$ defective structure D1"' and the $(1-4)^{th}$ defective structure D1"" may be different in the sixth width W6 of the sixth part P6.

Likewise, the $(2-1)^{th}$ defective structure D2', the $(2-2)^{th}$ defective structure D2", the $(2-3)^{th}$ defective structure D2"' and the $(2-4)^{th}$ defective structure D2"" may be defects of the same type and different sizes. Using FIG. 6 or 7 as examples, the $(2-1)^{th}$ defective structure D2', the $(2-2)^{th}$ defective structure D2", the $(2-3)^{th}$ defective structure D2"' and the $(2-4)^{th}$ defective structure D2"" may be different in the eighth width W8 of the eighth part P8.

Referring again to FIG. 8, the defect determining pattern DDP may be inspected for defects by using substrate inspection equipment (operation S820). The substrate inspection equipment according to embodiments may be first equipment for measuring structural defects and/or second equipment for measuring electrical defects. The substrate inspection equipment may include various electrical and mechanical parts, such as computer hardware and software for receiving user input, controlling mechanical equipment, performing analysis to determine defects, etc. The equipment may also include various optical and measurement components for performing measurements used in the analysis. Methods of measuring defects using the first equipment and the second equipment will now be described with reference to FIGS. 10 through 12.

Figure 10:
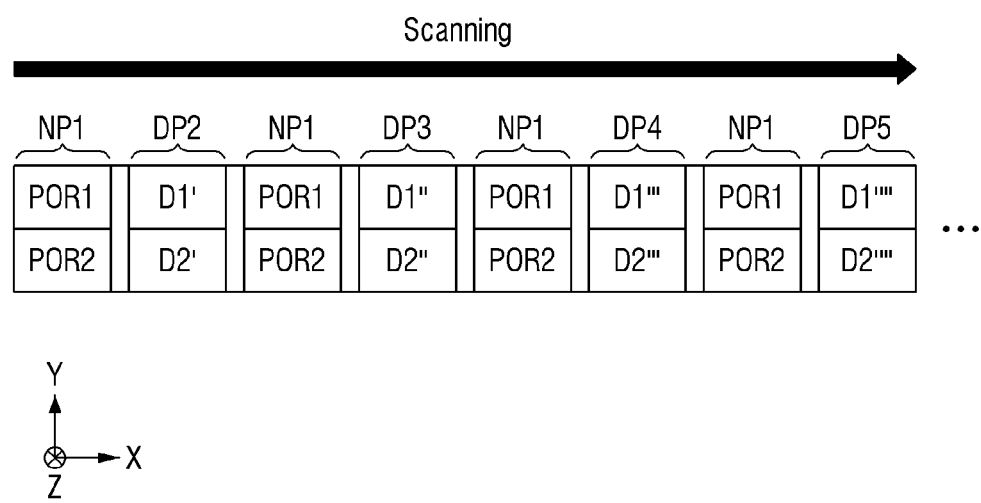
FIG. 10 is a diagram for explaining a method of inspecting a defect determining pattern for defects by using the first equipment for measuring structural defects according to embodiments.

FIG. 10 is a diagram for explaining a method of inspecting a defect determining pattern for defects by using the first equipment for measuring structural defects according to certain embodiments.

Referring to FIG. 10, the defect determining pattern DDP may be inspected for structural defects by using the first equipment. The first equipment may inspect whether the defect determining pattern DDP has a structural defect by using the average of measured values of the defect determining pattern DDP. For example, the first equipment may scan the defect determining pattern DDP to detect an image of the first normal pattern NP1, an image of the second defective pattern DP2, an image of the first normal pattern NP1, an image of the third defective pattern DP3, an image of the first normal pattern NP1, an image of the fourth defective pattern DP4, an image of the first normal pattern NP1, and an image of the fifth defective pattern DP5 and generate image data of each first normal pattern NP1 and image data of each of the second through fifth defective patterns DP2 through DP5. Then, the first equipment may generate average image data by taking the average of the image data of the defect determining pattern DDP. For example, regions or pixels within an image scan for all scanned images that are in common across all of the images may be included in the average image data to have a specific weighting (e.g., full weight), and regions that differ may be averaged across all of the images to have a different weight (e.g., less than the full weight). Next, the first equipment may determine a difference value between the average image data and the image data of each first normal pattern NP1 as a measured value of each first normal pattern NP1 (e.g., by comparing the weight of each region or pixel of the average image data to the regions or pixels that are known to be in each first normal pattern NP1). Likewise, the first equipment may determine a difference value between the average image data and the image data of each of the second through fifth defective patterns DP2 through DP5 as a measured value of each of the second through fifth defective patterns DP2 through DP5.

According to embodiments, when the first equipment is used, the $(1-1)^{th}$ defective structure D1', the $(1-2)^{th}$ defective structure D1'', the $(1-3)^{th}$ defective structure D1''' and the $(1-4)^{th}$ defective structure D1'''' may include undercut defects which are different in the sixth width W6 of the sixth part P6. In addition, the $(2-1)^{th}$ defective structure D2', the $(2-2)^{th}$ defective structure D2'', the $(2-3)^{th}$ defective structure D2''' and the $(2-4)^{th}$ defective structure D2'''' may include overcut defects which are different in the eighth width W8 of the eighth part P8.

Figure 11:
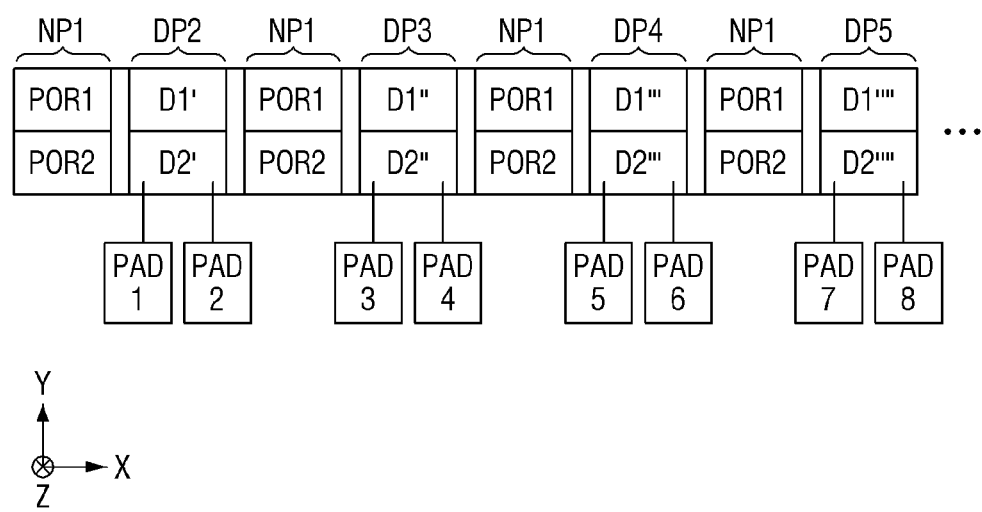
FIGS. 11 and 12 are respectively diagrams for explaining methods of inspecting a defect determining pattern for defects by using the second equipment for measuring electrical defects according to embodiments.
Figure 12:
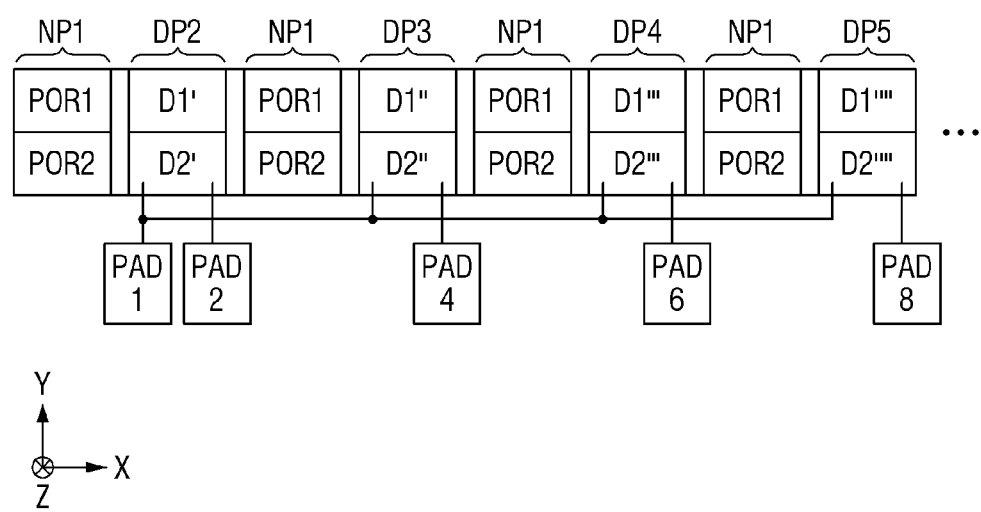

FIGS. 11 and 12 are respectively diagrams for explaining methods of inspecting a defect determining pattern for defects by using the second equipment for measuring electrical defects according to embodiments.

Referring to FIG. 11, a first pad PAD1 and a second pad PAD2 may be connected to the second defective pattern DP2. Likewise, a third pad PAD3 and a fourth pad PAD4 may be connected to the third defective pattern DP3, a fifth pad PAD5 and a sixth pad PAD6 may be connected to the fourth defective pattern DP4, and a seventh pad PAD7 and an eighth pad PAD8 may be connected to the fifth defect pattern DP5.

According to some embodiments, using the second equipment, a voltage or a current may be applied to the first pad PAD1, and a voltage or current output from the second pad PAD2 or a time when the voltage or current is output may be detected. Here, the voltage or current output from the second pad PAD2 or the time when the voltage or current is output may be determined as a measured value of the second defective pattern DP2. Likewise, using the second equipment, a voltage or a current may be applied to each of the third pad PAD3, the fifth pad PAD5 and the seventh pad PAD7, and voltages or currents output from the fourth pad PAD4, the sixth pad PAD6 and the eighth pad PAD8 or times when the voltages or currents are output may be determined as measured values of the third defective pattern DP3, the fourth defective pattern DP4 and the fifth defective pattern DP5, respectively.

Similarly, referring to FIG. 12, a first pad PAD1 may be commonly connected to the second defective pattern DP2, the third defective pattern DP3, the fourth defective pattern DP4, and the fifth defective pattern DP5. Here, a second pad PAD2, a fourth pad PAD4, a sixth pad PAD6, and an eight pad PAD8 may be connected to the second through fifth defective patterns DP2 through DP5, respectively.

According to embodiments, using the second equipment, a voltage or a current may be commonly applied to the first pad PAD1, and voltages or currents output from the second pad PAD2, the fourth pad PAD4, the sixth pad PAD6 and the eighth pad PAD8 or times when the voltages or currents are output may be determined as measured values of the second defective pattern DP2, the third defective pattern DP3, the fourth defective pattern DP4 and the fifth defective pattern DP5, respectively.

According to embodiments, when the second equipment is used, the $(1-1)^{th}$ defective structure D1', the $(1-2)^{th}$ defective structure D1'', the $(1-3)^{th}$ defective structure D1''' and the $(1-4)^{th}$ defective structure D1'''' may be bridge defects which are different in the sixth width W6 of the sixth part P6. In addition, the $(2-1)^{th}$ defective structure D2', the $(2-2)^{th}$ defective structure D2'', the $(2-3)^{th}$ defective structure D2''' and the $(2-4)^{th}$ defective structure D2'''' may be resistance defects which are different in the eighth width W8 of the eighth part P8.

Referring again to FIG. 8, a pattern to be used in a substrate inspection pattern SIP may be determined based on the measured values of the defect determining pattern DDP obtained using the first equipment and/or the second equipment, and the substrate inspection pattern SIP may be designed (operation S830). For illustrative purposes, reference will be made to FIG. 13.

Figure 13:
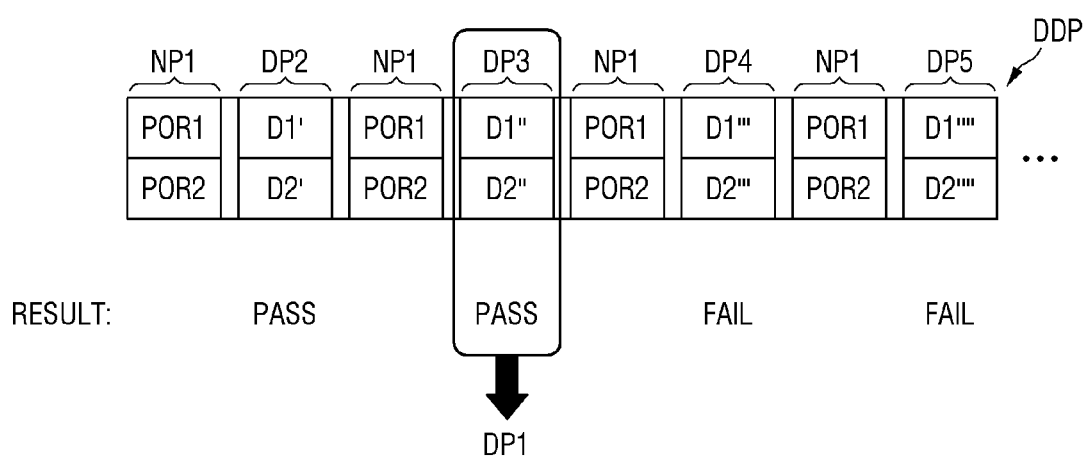
FIG. 13 is a diagram for explaining a method of determining a pattern to be used in a substrate inspection pattern according to embodiments.

FIG. 13 is a diagram for explaining a method of determining a pattern to be used in a substrate inspection pattern according to embodiments. It should be noted that a substrate inspection pattern is included on a substrate or wafer actually being manufactured into semiconductor devices to be separated and included in end products. According to certain embodiments, a defect determining pattern DDP, on the other hand, is included on a substrate not being manufactured into a semiconductor device, but which is used to determine which substrate inspection patterns should be included on a substrate/wafer actually being manufactured into semiconductor devices to be separated and included in end products. A semiconductor device as described herein may be in the form of a semiconductor chip or semiconductor package, for example, and may include a semiconductor chip formed and singulated from a wafer, as described above.

Referring to FIG. 13, the result of measuring each pattern of the defect determining pattern DDP using the first equipment and/or the second equipment may be determined as pass or fail. For example, one or more measured values, or measured value differences with normal patterns, of each of a plurality of defective patterns DP2, DP3, DP4 and DP5 included in the defect determining pattern DDP (e.g., an average image value, or voltage, current, or timing value) may be compared with one or more respective predetermined reference values to determine pass or fail.

According to certain embodiments, the measurement result of each defective pattern included in the defect determining pattern DDP may be analyzed, and a defective pattern determined last as pass may be determined as a first defective pattern DP1 to be used in the substrate inspection pattern SIP. For example, when the measurement result of the second defective pattern DP2 is pass, the measurement result of the third defective pattern DP3 is pass, the measurement result of the fourth defective pattern DP4 is fail and the measurement result of the fifth defective pattern DP5 is fail, the third defective pattern DP3 may be determined as the first defective pattern DP1. In some embodiments, the sizes of the different defective patterns are analyzed in order from smaller to larger, or larger to smaller, to help in this determination.

According to certain embodiments, since the first defective pattern DP1, also described as a selected defective pattern, is a defective pattern whose measurement result is pass, the measurement result of the substrate inspection pattern SIP may be determined as pass when the process center is located at the first point F1 (see FIG. 3). However, since an area (i.e., the dummy area 130) in which the first defective pattern DP1 is formed has a small process margin (that is, a narrow process window), the process window may be reduced from the first process window 10 to the second process window 15. Therefore, if the process center is changed to the second point F2 (see FIG. 2), the measurement result of the substrate inspection pattern SIP may be determined as fail.

Figure 14:
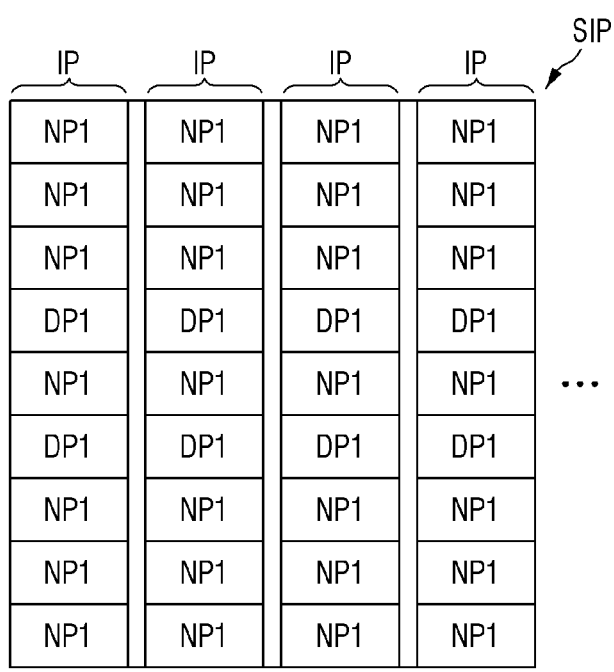
FIG. 14 illustrates a substrate inspection pattern SIP according to embodiments.
Figure 15:
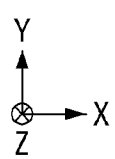
FIG. 15 illustrates a defect determining pattern DDP according to embodiments.
Figure 16:
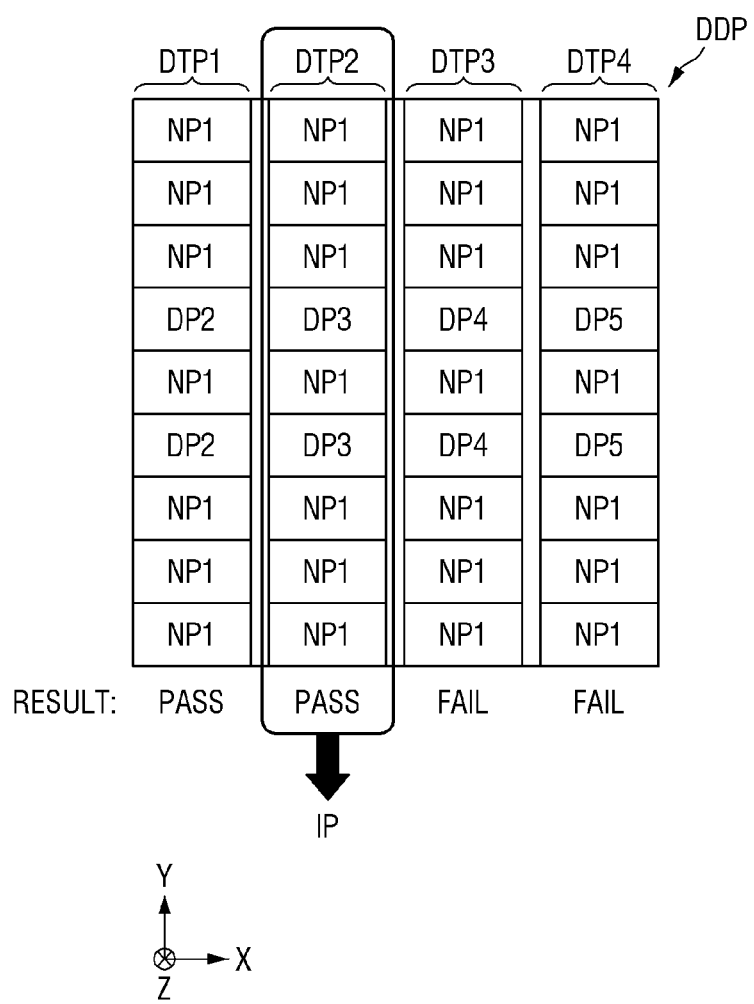
FIG. 16 illustrates a method of determining an inspection pattern to be used in a substrate inspection pattern according to embodiments.

FIG. 14 illustrates a substrate inspection pattern SIP according to embodiments. FIG. 15 illustrates a defect determining pattern DDP according to embodiments. FIG. 16 illustrates a method of determining an inspection pattern to be used in a substrate inspection pattern according to embodiments. For ease of description, a description of elements and features identical or similar to those described above will be omitted or given briefly.

Referring to FIG. 14, the substrate inspection pattern SIP may include inspection patterns IP arranged successively. The substrate inspection pattern SIP may be disposed in the dummy area 130 of the substrate 100.

Each of the inspection patterns IP may include one or more first defective patterns DP1 and a plurality of first normal patterns NP1. The first defective patterns DP1 and the first normal patterns NP1 may be located at the same level layer of the semiconductor device being manufactured.

Referring to FIG. 15, the defect determining pattern DDP may include a first determining pattern DTP1, a second determining pattern DTP2, a third determining pattern DTP3, and a fourth determining pattern DTP4. Although the defect determining pattern DDP includes four determining patterns in the drawing, embodiments are not limited to this case. The number of determining patterns included in the defect determining pattern DDP may vary as needed.

The first determining pattern DTP1 may include at least one second defective pattern DP2 and a plurality of first normal patterns NP1. The second determining pattern DTP2 may include at least one third defective pattern DP3 and a plurality of first normal patterns NP1. The third determining pattern DTP3 may include at least one fourth defective pattern DP4 and a plurality of first normal patterns NP1. The fourth determining pattern DTP4 may include at least one fifth defective pattern DP5 and a plurality of first normal patterns NP1.

Referring to FIG. 16, in a method similar to the above-described method, a determining pattern measured last as pass is determined as an inspection pattern IP by using defect measurement results of the defect terming pattern DDP. For example, when the defect measurement result of the first determining pattern DTP1 is pass, the defect measurement result of the second determining pattern DTP2 is pass, the defect measurement result of the third determining pattern DTP3 is fail and the defect measurement result of the fourth determining pattern DTP4 is fail, the second determining pattern DTP2 is determined as the inspection pattern IP.

Figure 17:
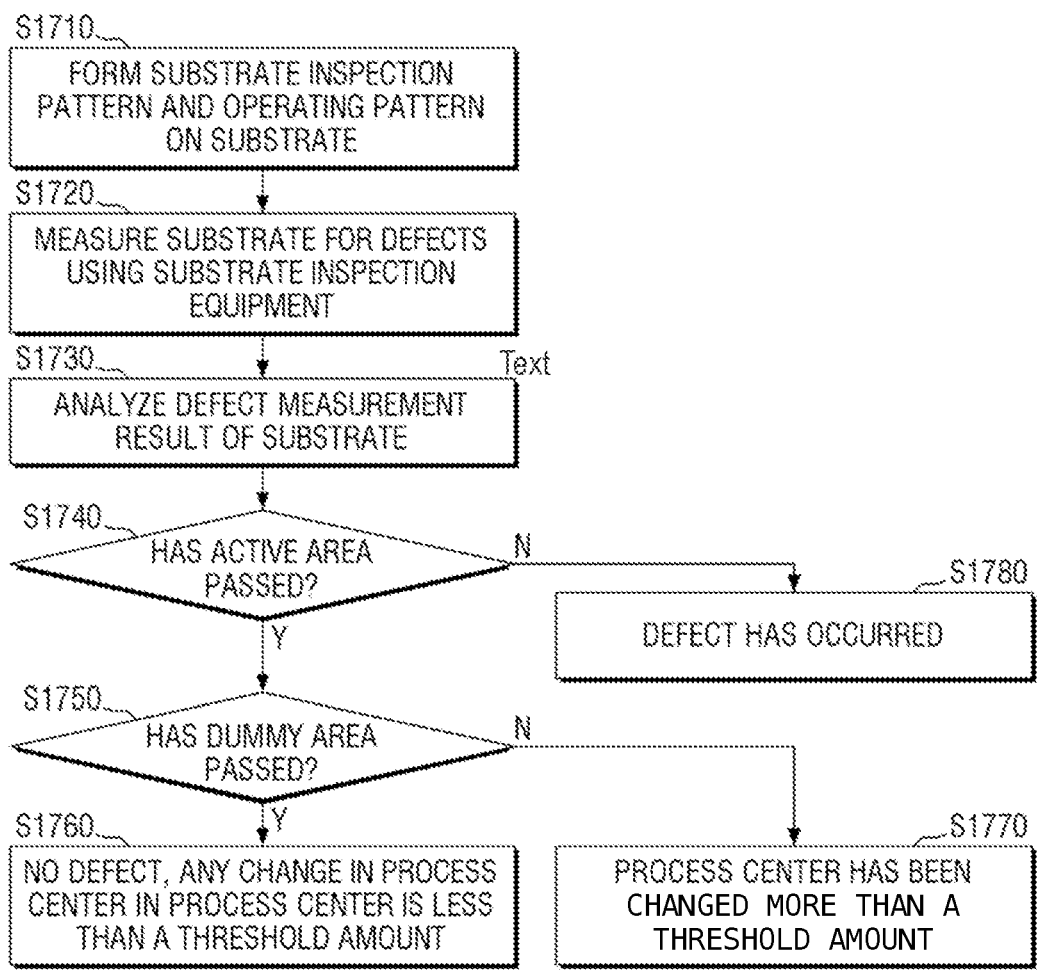
FIG. 17 is a flowchart illustrating a substrate inspection method according to embodiments.

FIG. 17 is a flowchart illustrating a substrate inspection method according to embodiments.

Referring to FIG. 17, an operating pattern OP may be formed on an active area 120 of a substrate 100, and a substrate inspection pattern SIP may be formed on a dummy area 130 of the substrate 100 (operation S1710). The active area 120 may be an area that is used during normal operations of a semiconductor device formed from the substrate, and the dummy area 130 may be an area that is not used during normal operation of the semiconductor device. For example, the active area 120 may include circuitry used for operating the semiconductor device (e.g., a semiconductor chip), such as for supplying signals or voltage to portions of the semiconductor device that are used to store and retrieve, or to process data. The dummy area 130 may be an area that does not include such circuitry and/or is not used for any of these types of operating functions.

The substrate 100 is inspected for defects by using substrate inspection equipment (operation S1720). Then, the defect measurement result of the substrate 100 is analyzed (operation S1730). It is determined whether the defect measurement result of the active area 120 of the substrate 100 indicates pass (operation S1740).

If the defect measurement result of the active area 120 of the substrate 100 indicates pass, it is determined whether the defect measurement result of the dummy area 130 of the substrate 100 indicates pass (operation S1750).

If the defect measurement result of the active area 120 of the substrate 100 indicates pass and the defect measurement result of the dummy area 130 of the substrate 100 indicates pass, it is determined that a corresponding process is without a defect and without a change beyond a threshold amount in a process center (operation S1760). For example, a manufacturing computer system can be programmed to automatically proceed with manufacturing operations without issuing any notification when it is determined that the process is without defect.

If the defect measurement result of the active area 120 of the substrate 100 indicates pass and the defect measurement result of the dummy area 130 of the substrate 100 indicates fail, it is determined that the corresponding process is without a defect, but its process center has been changed more than a threshold amount (operation S1770). For example, a manufacturing computer system can be programmed to automatically issue a notification when it is determined that the process center has changed in this manner. As a result, a user may recognize the change in the process center and initialize the process center by modifying a process recipe or changing hardware and/or software of process equipment.

If the defect measurement result of the active area 120 of the substrate 100 indicates fail, a semiconductor substrate (or semiconductor device) that has gone through the corresponding process is determined to be defective (operation S1780).

Figure 18:
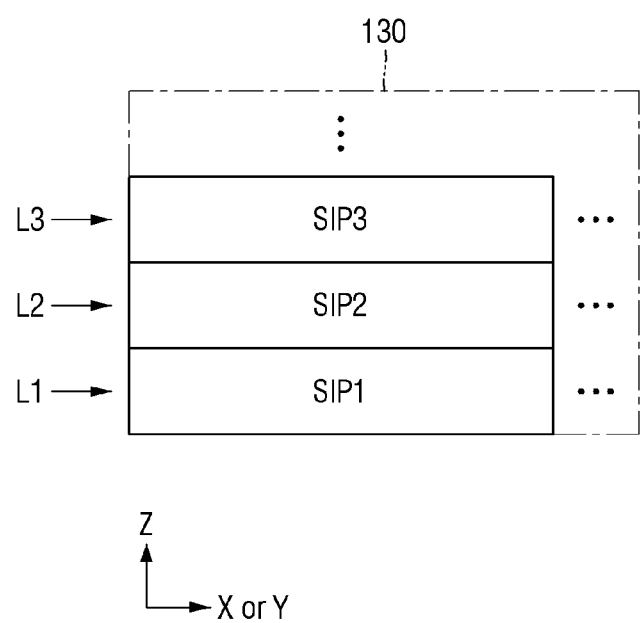
FIG. 18 illustrates first through third substrate inspection patterns SIP1 through SIP3 according to embodiments.

FIG. 18 illustrates first through third substrate inspection patterns SIP1 through SIP3 according to embodiments.

Referring to FIG. 18, a plurality of substrate inspection patterns SIP1 through SIP3 may be stacked vertically (in the Z direction) in a dummy area 130 of a substrate 100. For example, the first substrate inspection pattern SIP1 may be formed at a first level layer L1 in the dummy area 130 of the substrate 100. In addition, the second substrate inspection pattern SIP2 may be formed at a second level layer L2 in the dummy area 130 of the substrate 100. In addition, the third substrate inspection pattern SIP3 may be formed at a third level layer L3 in the dummy area 130 of the substrate 100. In other words, in the dummy area 130 of the substrate 100, the second substrate inspection pattern SIP2 may be formed on the first substrate inspection pattern SIP1, and the third substrate inspection pattern SIP3 may be formed on the second substrate inspection pattern SIP2.

The first substrate inspection pattern SIP1, the second substrate inspection pattern SIP2, and the third substrate inspection pattern SIP3 according to this embodiment may include different defects, or at least some of the first through third substrate inspection patterns SIP1 through SIP3 may include the same defect. Therefore, at least some of the first through third substrate inspection patterns SIP1 through SIP3 may be measured using different substrate inspection equipment. For example, the first substrate inspection pattern SIP1 and the second substrate inspection pattern SIP2 may be measured for defects using first equipment, and the third substrate inspection pattern SIP3 may be measured for defects using second equipment. However, this is only an example, and embodiments are not limited to this case. According to embodiments, since a plurality of substrate inspection patterns SIP1 through SIP3 can be stacked in the dummy area 130, there is no need to form the substrate inspection patterns SIP1 through SIP3 in different areas. This can increase the integration density of semiconductor devices 110 and reduce cost.

Although the method of detecting a change in the process center using a substrate inspection pattern SIP according to embodiments has been described above, embodiments are not limited to this method. Since the substrate inspection pattern SIP includes a part in which a defective structure is intentionally formed, the type, size, shape and position of the defective structure included in the substrate inspection pattern SIP can be identified in advance. Since the type, size, shape and position of the defective structure are already known, the substrate inspection pattern SIP can be used in various fields.

According to embodiments, a defect of the substrate inspection pattern SIP may be detected using substrate inspection equipment, and the type, size, shape and position of the detected defect structure may be compared with those of the known defective structure to evaluate the performance of the substrate inspection equipment.

According to embodiments, a substrate inspection pattern SIP may be formed to include intentionally formed defective structures by using an extreme ultraviolet (EUV) exposure device. Here, the intentionally formed defective structures may correspond to the positions of slits of the EUV exposure device, respectively. Optical proximity correction (OPC) may be performed using the type, size, shape and position of a defective structure corresponding to the position of each slit.

According to embodiments, a substrate inspection pattern SIP may be formed using first photoresist, and a substrate inspection pattern SIP may be formed using a second photoresist. Here, the size, shape and position of a defective structure included in the substrate inspection pattern SIP formed using the first photoresist may be compared with those of a defective structure included in the substrate inspection pattern SIP formed using the second photoresist. In doing so, it is possible to identify material characteristics of the first photoresist and the second photoresist.

In concluding the detailed description, those skilled in the art will appreciate that many variations and modifications may be made to the preferred example embodiments without departing from the spirit and scope of the present disclosure. Therefore, the disclosed preferred example embodiments of the present disclosure are used in a generic and descriptive sense only and not for purposes of limitation.

What is claimed is:

1. A semiconductor device comprising:
 a first normal pattern which is disposed in an active area of a semiconductor chip, wherein the first normal pattern has a particular shape and the active area includes circuitry for operating the semiconductor chip, which circuitry includes the first normal pattern; and
 a first defective pattern and a second normal pattern which are disposed in a dummy area of the semiconductor chip, wherein the dummy area of the semiconductor chip is an area that does not perform functions for operating the semiconductor chip,
 wherein the second normal pattern has the same shape as the first normal pattern and the first defective pattern has the same shape as the first normal pattern except for a first defect included in the first defective pattern,
 wherein the first normal pattern, the second normal pattern, and the first defective pattern are disposed at a first level layer of the semiconductor chip, and the first defect includes an intentional defect from a plan view,
 wherein the first defective pattern comprises a first part and a second part, and the second normal pattern comprises a third part corresponding to the first part and that matches the first part in shape and size and a fourth part corresponding to the second part, wherein the second part includes the first defect and matches the fourth part in shape and size except for the first defect, and
 wherein the second part and fourth part have the same pattern in the plan view except that the second part includes a least one piece of material that is absent from the fourth part and that comprises the first defect.

2. The semiconductor device of claim 1, wherein the second part including the first defect has an extended portion compared to the fourth part.

3. The semiconductor device of claim 1, wherein the first defective pattern is one of a plurality of identical first defective patterns, and the second normal pattern is one of a plurality of identical second normal patterns, and the plurality of identical first defective patterns and plurality of second normal patterns are alternately disposed at the first level layer.

4. The semiconductor device of claim 1, further comprising:
   a second defective pattern and a third normal pattern which are disposed in the dummy area of the semiconductor chip at the first level layer,
   wherein the third normal pattern has the same shape as the first normal pattern and the second defective pattern has the same shape as the first normal pattern except for a second defect included in the second defective pattern, the second defect different from the first defect.

5. The semiconductor device of claim 4, wherein the third normal pattern comprises a fifth part and a sixth part, and the second defective pattern comprises a seventh part corresponding to the fifth part and that matches the fifth part in shape and size and an eighth part corresponding to the sixth part and that includes the second defect and matches the sixth part in shape and size except for the second defect, wherein in the plan view, the sixth part includes a piece of material that is absent from the eighth part, which missing material comprises the second defect.

6. The semiconductor device of claim 4, wherein the first defective pattern includes an undercut defect, and the second defective pattern includes an overcut defect.

7. The semiconductor device of claim 4, wherein the first defective pattern includes a bridge defect, and the second defective pattern includes a resistance defect.

8. The semiconductor device of claim 1, further comprising:
   a third normal pattern which is disposed in the active area of the semiconductor chip; and
   a second defective pattern and a fourth normal pattern which are disposed in the dummy area of the semiconductor chip,
   wherein the third normal pattern is disposed at a second level layer, and the second defective pattern and the fourth normal pattern are disposed at the second level layer, wherein the second level layer is disposed on the first level layer.

9. The semiconductor device of claim 8, wherein the first defective pattern and the second defective pattern are different in shape from each other.

10. The semiconductor device of claim 9, wherein the first defective pattern comprises a structural defect of the semiconductor chip, and the second defective pattern comprises an electrical defect of the semiconductor chip.

11. The semiconductor device of claim 1, wherein the first normal pattern, the first defective pattern, and the second normal pattern are each conductive patterns.

12. A semiconductor device comprising:
   a first, non-operating, pattern which is disposed in a dummy area of a semiconductor chip and comprises first inspection patterns arranged successively; and
   a second, operating, pattern which is disposed in an active area of the semiconductor chip and is for operating the semiconductor chip,
   wherein each of the first inspection patterns comprises one or more first defective patterns and a plurality of first normal patterns, wherein each of the first normal patterns comprises a first part and a second part, and each of the first defective patterns comprises a third part corresponding to the first part and a fourth part corresponding to the second part, wherein the first part matches the third part in shape and size, and the second part and the fourth part match each other in shape and size, except for a first intentional defect included in the fourth part and formed at a predetermined location from a plan view,
   wherein the first part, second part, third part, and fourth part are all at the same level layer, and
   wherein the second part and fourth part have the same pattern in the plan view, except the fourth part includes at least one piece of material that is absent from the second part and that comprises the first defect, or the second part includes at least one piece of material that is absent from the fourth part such that the missing material in the fourth part comprises first defect.

13. The semiconductor device of claim 12, wherein each of the first defective patterns comprises a first defective structure and a second defective structure.

14. The semiconductor device of claim 13, wherein the first defective structure and the second defective structure include different defects from each other.

15. The semiconductor device of claim 14, wherein the first defective structure includes an undercut defect, and the second defective structure includes an overcut defect.

16. The semiconductor device of claim 14, wherein the first defective structure includes a bridge defect, and the second defective structure includes a resistance defect.

17. The semiconductor device of claim 12, further comprising:
   a third pattern which is disposed on the first pattern and comprises second inspection patterns different from the first inspection patterns; and
   a fourth pattern which is disposed on the second pattern and has a different shape from the second pattern.

18. The semiconductor device of claim 17, wherein each of the first inspection patterns comprises a structural defect of the semiconductor chip, and each of the second inspection patterns comprises an electrical defect of the semiconductor chip.

19. The semiconductor device of claim 12, wherein each of the first normal patterns and each of the first defective patterns are conductive patterns.

* * * * *